United States Patent [19]

Yoshikawa

[11] Patent Number: 5,000,834
[45] Date of Patent: Mar. 19, 1991

[54] FACING TARGETS SPUTTERING DEVICE

[75] Inventor: Takamasa Yoshikawa, Saitama, Japan

[73] Assignee: Pioneer Electronic Corporation, Tokyo, Japan

[21] Appl. No.: 405,818

[22] Filed: Sep. 8, 1989

[30] Foreign Application Priority Data

Feb. 17, 1989 [JP] Japan .................................... 1-37741

[51] Int. Cl.$^5$ ............................................. C23C 14/35
[52] U.S. Cl. .......................... 204/298.08; 204/192.12; 204/192.15; 204/192.2; 204/298.17
[58] Field of Search ....................... 204/192.12, 192.15, 204/192.2, 298.17, 298.08

[56] References Cited

U.S. PATENT DOCUMENTS 4,828,668  5/1989  Yamazaki et al. ............. 204/298.08
4,963,524 10/1990  Yamazaki .................................. 505/1

FOREIGN PATENT DOCUMENTS 63-140079 6/1988 Japan ............................... 204/298.17
 2-50960 2/1990 Japan ............................... 204/298.17

*Primary Examiner*—Aaron Weisstuch
*Attorney, Agent, or Firm*—Sughrue, Mion, Zinn Macpeak & Seas

[57] ABSTRACT

A Facing Targets Sputtering device for making a thin film comprises: a pair of targets with magnets placed at opposite positions within a container so as to face each other so as to maintain a space for a plasma region; and first and second power sources respectively connected to the both targets and being controllable independently from each other, so that electric energies supplied to the targets can be independently controlled. Therefore, the composition of the thin film can be readily selected and controlled even during operation.

3 Claims, 3 Drawing Sheets

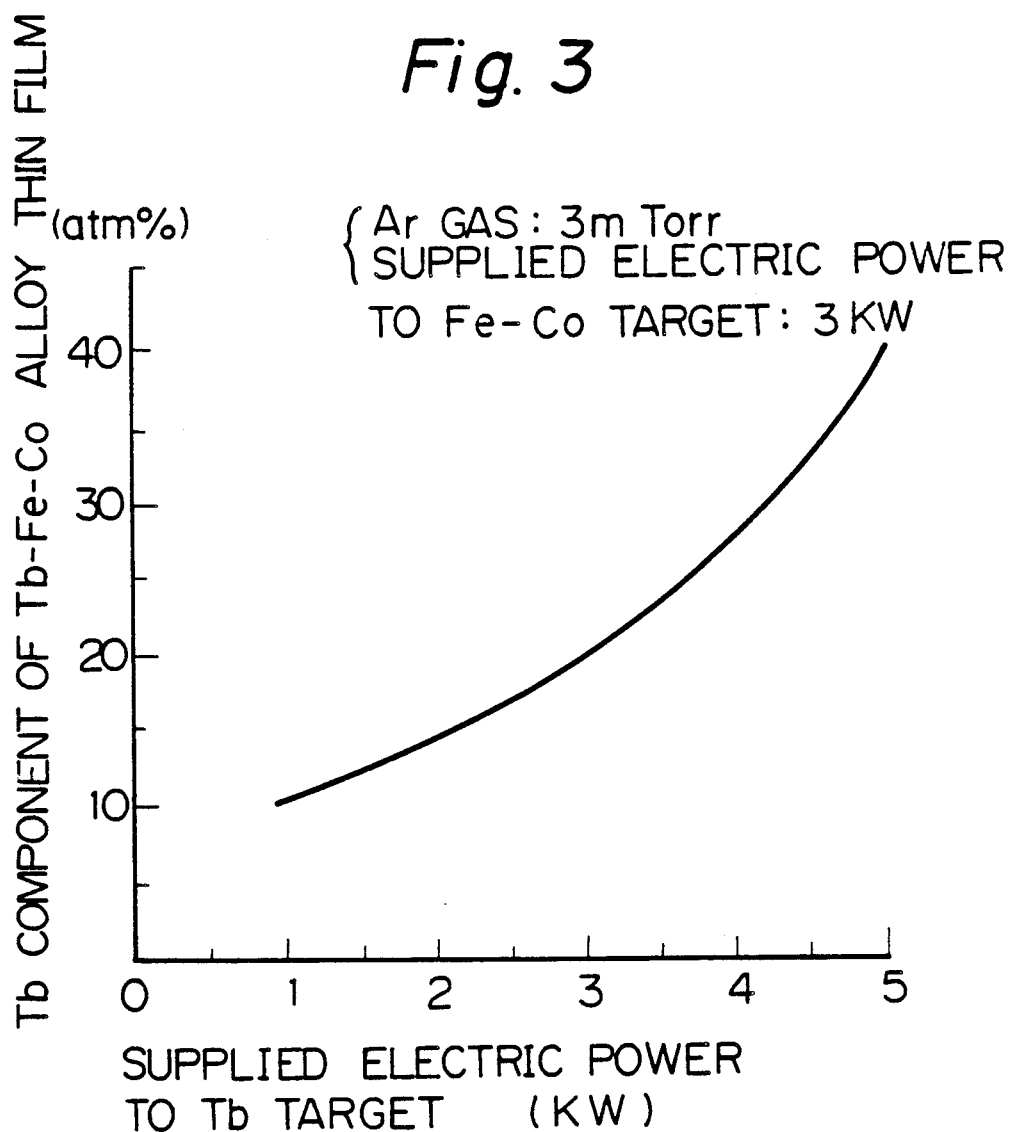

FACING TARGETS SPUTTERING DEVICE

BACKGROUND OF THE INVENTION

1. Field of the Invention

The present invention relates to a device for making a thin film on a substrate through a method of Facing Targets Sputtering.

2. Description of the Prior Art

There are known a vacuum deposition method, a sputtering method etc. as methods for forming thin films. The sputtering method is widely used for forming a thin film on a substrate made of PMMA because of intimacy between the substrate and the thin film formed therethrough. The amorphous thin film of rare earth—transition metal alloy formed through the sputtering method is applied to an erasable magneto-optical recording medium.

The sputtering method is performed as follows: Positive ions of an inert gas such as Argon (Ar) first created by a glow discharge are accelerated toward a cathode or target, and then they impinge upon the target. As a result of ionic bombardment, neutral atoms and ions are removed from the target surface into a vacuum chamber due to the exchange of momentum therebetween. The liberated or sputtered atoms and ions are consequently deposited on a preselected substrate disposed in the vacuum chamber.

FIG. 1 shows a conventional Facing Targets Sputtering device which accomplishes the sputtering method. As shown in FIG. 1, two target plates 5 are respectively connected and disposed onto two target holders 6 which are fixed to both inner ends of an air-tight container 1 so as to make the target plates 5 face each other. The target holders 6 are electrically isolated from the air-tight container 1. A pair of permanent magnets 8 are accommodated in the target holders 6 so as to create a magnetic field therebetween substantially perpendicular to the surface of the target plates 5. A substrate 11 is disposed closely to the magnetic field (which will define a plasma region 20) so as to preferably face it. A power source 10 is connected to the pair of the target plates 5 respectively. The air-tight container 1 is grounded. By applying a voltage across the container 1 and the target plates 5, a glow discharge is established between the container 1 and the plates 5. The intensity and extent of the established magnetic field can be controlled by regulating the magnitude of a current flowing through the coil 22 disposed around the air-tight container 1 at the outside.

The electrons emitted from the both target plates 5 by applying the voltage are confined between the target plates 5 because of the magnetic field to promote the ionization of the inert gas so as to form a plasma region 20. The positive ions of the inert gas existing in the plasma region 20 are accelerated toward the target plates 5, whereby those accelerated particles violently impinge upon the target plates 5. The bombardment of the target plates 5 by the accelerated particles of the inert gas and ions thereof causes atoms of the material forming the plates 5 to be emitted. The substrate 11 on which the thin film is to be disposed is placed around the plasma region 20, so that the bombardment of these high energy particles and ions against the thin film plane is avoided because of effective confinement of the plasma region 20 by the magnetic field.

In this way, the metallic atoms of the target plates 5 are deposited on the substrate 11 without unwanted temperature elevation of the substrate nor any defect in the formed thin film and/or damage on the surface of the substrate.

In such a Facing Targets Sputtering device, the composition of the alloy thin film can be changed either by replacing a plurality of targets different in composition from each other or by using a composite target which has a plurality of surface regions made of different metal materials.

However, it has been a problem in such a conventional Facing Targets Sputtering device that the replacement of the targets requires some tedious manual operations and takes too much time. Furthermore, it is not so easy to manufacture such a composite target.

SUMMARY OF THE INVENTION

An object of the present invention is to provide a Facing Targets Sputtering device which can control the rate of components of the thin film without tedious effort while depositing the thin film on the substrate.

According to the present invention, the above object is accomplished by a Facing Targets Sputtering device which comprises: an air-tight container in which an inert gas is admittable and exhaustible; a pair of target plates so placed at opposite ends spaced from each other within the air-tight container so as to face each other and to form a plasma region therebetween; a pair of magnets respectively disposed adjacent to the target plates such that magnet poles of different polarity face each other across the plasma region thereby to establish a magnetic field at the plasma region between the target plates; and a substrate holder disposed close to the plasma region, said substrate holder holding a substrate on which a thin film is to be deposited, and which further comprises a first variable power source for supplying a first electric power across the one of the target plates and the container, and a second variable power source for supplying a second electric power across the other of the target plates and the container, the first and second variable power source being able to vary the first and second electric powers independently of each other.

BRIEF DESCRIPTION OF THE DRAWINGS

FIG. 3 is a graph showing a relationship between supplied electric powers to a Tb target and Tb component values of a resulting Tb-Fe-Co alloy thin film obtained by the Facing Targets Sputtering device according to the present invention.

DETAILED DESCRIPTION OF A PREFERRED EMBODIMENT

A preferred embodiment according to the present invention will be explained while referring to the accompanying drawings.

Figure 1:
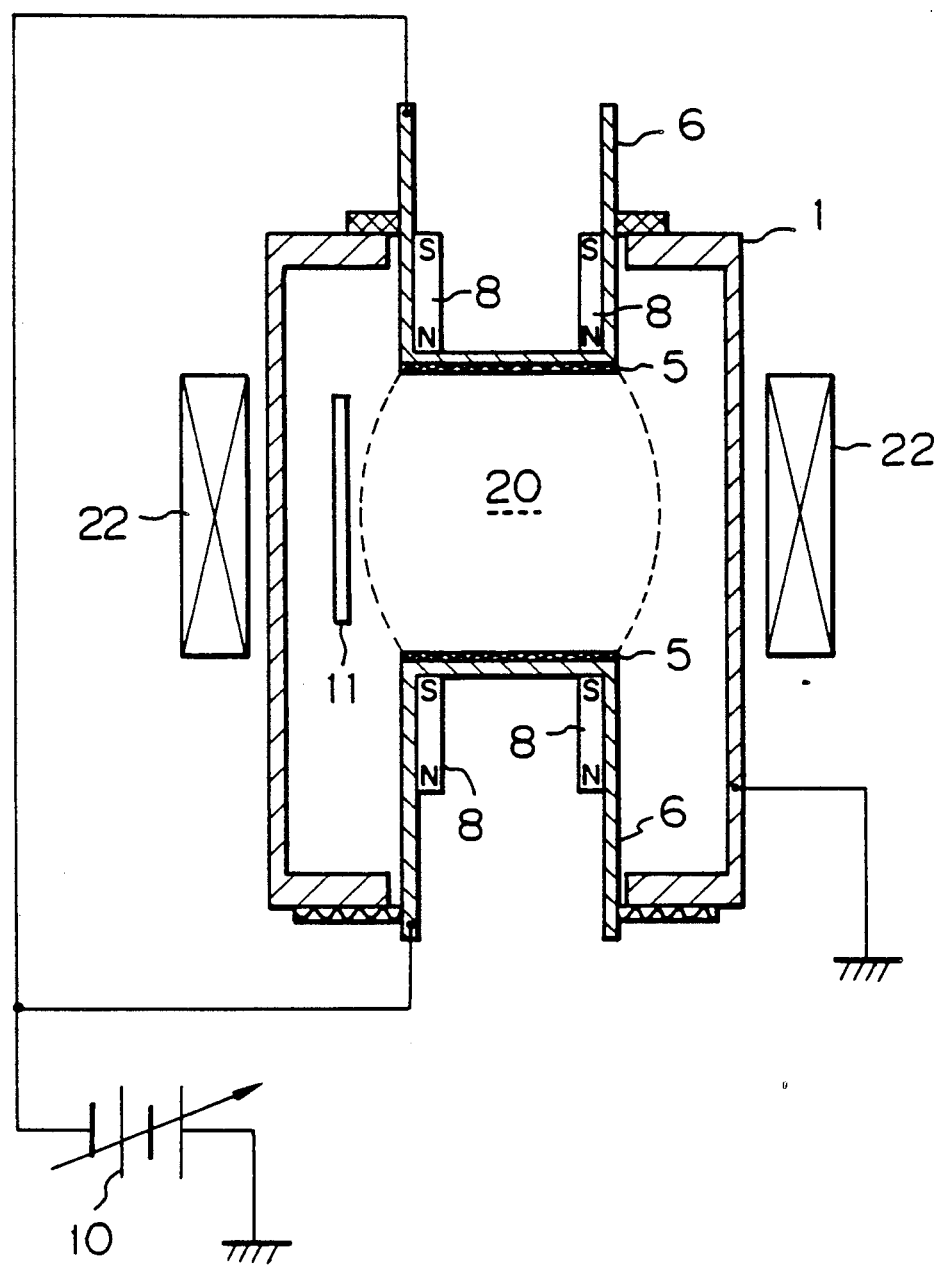
FIG. 1 is a schematic section view of a conventional Facing Targets Sputtering device.
Figure 2:
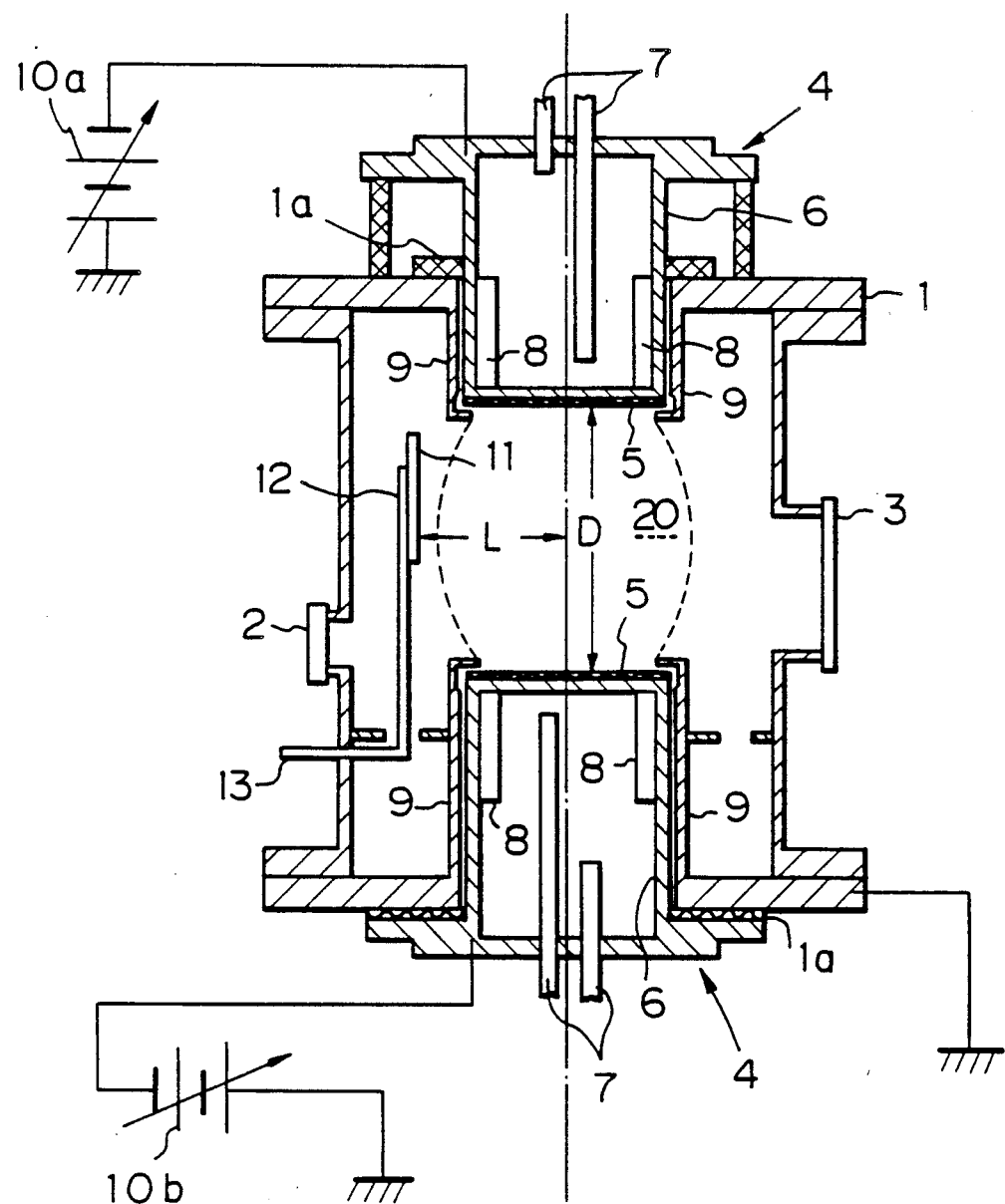
FIG. 2 is a schematic section view of a Facing Targets Sputtering device according to the present invention.

FIG. 2 shows a Facing Targets Sputtering device according to the present invention. This device has a cylindrical air-tight container 1 whose both ends are closed to form an inner hollow space. The air-tight container 1 is provided with a magnetic field coil like 22 in FIG. 1 (not shown) on the side surface thereof for controlling a magnetic field in the inner space thereof.

An inert gas inlet passage 2 is provided at the side wall of the container 1 so as to feed an inert gas such as Ar gas from the outside to the inner space. An exhaust pipe 3 communicating to a vacuum pump and a diffusion pump is also provided at the side wall of the container 1 so as to ventilate exhausted gases to the outside so as to maintain a vacuum condition in the inner space.

A pair of sputtering source mounts 4 are fixed to or placed at two opposite positions within the container 1. Each of the sputtering source mounts 4 is electrically insulated from the container 1 by an insulating member 1a. The sputtering source mount 4 comprises a cylindrical hollow target holder 6 at the end surface of which a target plate 5 is held, and a pair of coolant passages 7 for circulating coolant water in the hollow space thereof in order to cool the target plate 5. The target plates 5 are respectively disposed on the sputtering source mounts 4 so as to face each other and are spaced from each other by a distance "D". On the inner side wall of each of the target holders 6, a tubular permanent magnet 8 is disposed adjacent to the target plate 5 at the backside thereof. The permanent magnets 8 are arranged in such a manner that poles of different polarities of the permanent magnets 8 are oriented facing towards each other so that a magnetic field is established across the space between the target plates 5.

A substrate holder 12 holding a substrate 11 on which a thin film is to be deposited is disposed around the space defined between by the target plates 5, i.e., a plasma region 20 in which plasma is confined and maintained by the magnetic field, in such a manner that the substrate 11 faces the plasma region 20 substantially in parallel to a center line (one dot line) of the target plates 5. The substrate holder 12 is provided with a coolant passage 13 for circulating coolant water in the hollow space thereof in order to cool the substrate 11.

A cylindrical anode 9 is disposed around each of the target holders 6 and is electrically insulated from the target holder 6 and the target plate 5 and further is grounded via the container 1. In one of the sputtering source mounts 4, the corresponding target plate 5 is electrically connected through the target holder 6 to a first variable power source 10a for supplying a negative voltage or a first electric power across the plate 5 and the container 1. On the other hand, the other target plate 5 of the other sputtering source mount 4 is connected to a second variable power source 10b for supplying a negative voltage or a second electric power across the plates 5 and the container 1, the second variable power source 10b being controllable in its output voltage or power independently from the first variable power source 10a. The substrate holder 12 is electrically isolated from the container 1 and the sputtering source mounts 4.

The first and second variable power sources 10a and 10b respectively supply independent powers to the pair of target plates 5 so that the glow discharge is established between the side wall of the air-tight container 1 and the target plates 5 to create the plasma region 20 of Ar. By using the permanent magnets 8 having a sufficient magnetic force, the plasma created between the target plates 5 facing each other is confined within the plasma region so as not to reach the substrate 11. In this way, the plasma is controlled by the magnetic force. According to the present Facing Targets Sputtering device, the emitted atoms from the target plates 5 are only deposited on the surface of the substrate 11 to form a thin film made of materials of the target plates 5.

By using the embodiment of the Facing Targets Sputtering device, a Tb-Fe-Co alloy thin film was formed on a substrate 11 made of PMMA.

In one of the sputtering source mounts 4, a Tb target was mounted on the target holder 6 connected to a first power source 10a. In the other of the sputtering source mounts 4, a Fe-Co target was mounted on the other target holder 6 connected to a second power source 10b.

The gases inside the air-tight container 1 were exhausted by the pumps and a vacuum was obtained. Ar gas was then fed to the container 1 and maintained at up to 3 mTorr.

The powers of the first and second power sources 10a, 10b were equally increased up to a predetermined value to establish the glow discharge.

While the supplied second electric power of second power source 10b connected to the Fe-Co target was kept constant at 3 kW, the first power of first power source 10a connected to the Tb target was changed within a range of 1 through 5 kW. In this way, various Tb-Fe-Co thin films having different Tb component percentages from each other were obtained on a plurality of substrates.

FIG. 3 shows the relationship between supplied electric power to a Tb target and percent Tb components of resulting Tb-Fe-Co alloy thin films obtained by the Facing Targets Sputtering device of the embodiment. As seen from FIG. 3, the supplied electric power of a Tb target is substantially proportional to the Tb component of the resulting Tb-Fe-Co alloy thin films. In the embodiment of the Facing Targets Sputtering device, the Tb component of the resulting Tb-Fe-Co alloy thin films can be controlled within a range of 10 through 40%.

In the above mentioned embodiment, two first and second power sources 10a, 10b of a direct current type are used which are controlled independently from each other.

In another embodiment, one power source connected to two electric power changing means such as two variable resistors is used, and the two resistors may be respectively connected to the pair of target plates 5 through the target holders 6 so as to independently supply different amounts of power to each of the target plates 5.

Furthermore, the first and second power sources 10a, 10b or two power supplying means may be a DC or a high frequency AC electric power source. In other words, a combination, wherein the first power source 10a is of DC and the second power source 10b is of high frequency, may be used. Another combination, wherein the first power source 10a is of high frequency and the second power source 10b is of DC. may also be allowable. Of course, both of the first and second power sources 10a, 10b may be high frequency power sources.

As mentioned above, the Facing Targets Sputtering device according to the present invention has first and second power sources 10a, 10b which are respectively connected to two targets facing each other and controllable independently from each other. The electric energies supplied to the targets are independently controlled. Therefore, the components of the thin film to be formed are easily controlled in every sputtering batch process. In addition, the composition of the thin film can be changed in the direction of the thickness of the film by using the Facing Targets Sputtering device according to the present invention.

What is claimed is:

1. A facing targets sputtering device for depositing an alloyed thin film which comprises:
   an air-tight container in which an inert gas is admittable and exhaustible;
   a pair of target plates made of materials different from each other and placed at opposite ends of said air-tight container respectively so as to face each other and form a plasma region therebetween;
   a pair of magnets respectively disposed adjacent to said target plates such that magnet poles of different polarities face each other across said plasma region thereby to establish a magnetic field of said plasma region between said target plates;
   and a substrate holder disposed adjacent to said plasma region, said substrate holder adapted to hold a substrate on which an alloyed thin film is to be deposited,
   and which further comprises a first variable power supply means for supplying a first electric power across a first one of said target plates and said container, and a second variable power supply means for supplying a second electric power across the second of said target plates and said container, wherein the first and second variable power supply means vary the first and second electric powers independently of each other during the operation of the device so that the composition of a resultant alloyed thin film is changed in the direction of thickness thereof.

2. A facing targets sputtering device according to claim 1, wherein each of the first and second power supply means is a DC or an AC electric variable power source.

3. A facing targets sputtering device according to claim 1, wherein the first power supply means is a DC electric variable power source, and the second power supply means is an AC electric variable power source.

* * * * *